United States Patent [19]

Kamins et al.

[11] Patent Number: 4,507,158

[45] Date of Patent: Mar. 26, 1985

[54] TRENCH ISOLATED TRANSISTORS IN SEMICONDUCTOR FILMS

[75] Inventors: Theodore I. Kamins; Donald R. Bradbury, both of Palo Alto; Clifford I. Drowley, Mountain View, all of Calif.

[73] Assignee: Hewlett-Packard Co., Palo Alto, Calif.

[21] Appl. No.: 522,767

[22] Filed: Aug. 12, 1983

[51] Int. Cl.$^3$ .................... H01L 21/76; H01L 21/95
[52] U.S. Cl. ................... 148/175; 29/576 W;
29/576 T; 29/578; 29/580; 148/DIG. 26;
148/DIG. 50; 148/DIG. 85; 156/612; 357/49;
357/50
[58] Field of Search ............... 29/576 W, 576 T, 578,
29/580; 148/175, 187; 156/612, 643; 357/49, 50

[56] References Cited

U.S. PATENT DOCUMENTS

| | | | |
|---|---|---|---|
| 3,425,879 | 2/1969 | Shaw et al. | 148/175 |
| 3,574,008 | 4/1971 | Rice | 148/175 |
| 3,634,150 | 1/1972 | Horn | 148/175 |
| 4,369,565 | 1/1983 | Muramatsu | 29/578 X |
| 4,371,421 | 2/1983 | Fan et al. | 148/171 X |
| 4,378,629 | 4/1983 | Bozler et al. | 29/580 |

FOREIGN PATENT DOCUMENTS

WO81/02948 10/1981 PCT Int'l Appl. ............... 156/612

OTHER PUBLICATIONS

Ser. No. 522,804 filed 8-12-83, Bradbury et al.

*Primary Examiner*—William G. Saba
*Attorney, Agent, or Firm*—Cheryl L. Shavers; Jeffery B. Fromm

[57] ABSTRACT

A method for trench isolation of a silicon island for device fabrication using only conventional very large scale integration (VLSI) techniques is provided. The combination of the sidewall isolation achieved with the trench isolation and the underlying oxide film create a totally dielectrically isolated structure without the possibility of latch-up between adjacent devices.

27 Claims, 6 Drawing Figures

TRENCH ISOLATED TRANSISTORS IN SEMICONDUCTOR FILMS

BACKGROUND OF THE INVENTION

Isolation between nearby circuit elements has been an object of intense investigation in the integrated circuit development field. Initially, p-n junctions were used to isolate adjacent elements, and more recently local oxidation techniques have been used to achieve lateral isolation between adjacent circuit elements. While these techniques have been useful, a practical means of completely surrounding a circuit element with an insulating layer of silicon dioxide has been sought to provide total isolation.

Traditional dielectric isolation technology requires critical mechanical polishing. Since the circuit density is low and the cost is high, this technology has been limited to specialized applications, such as radiation hardened integrated circuits. Silicon on sapphire has also been extensively developed, but the high substrate cost and limited device quality has restricted its application. More recently, melting and recrystallization of silicon films deposited on insulating layers has been a topic of major investigation. However, severe temperature gradients experienced during the recrystallization are a major limitation.

SUMMARY OF THE INVENTION

This disclosure demonstrates a new isolation technique which permits total dielectric isolation of adjacent devices in chemical vapor deposited epitaxial films over insulators by using lateral trench isolation. The process is compatible with the standard vary large scale integration (VLSI) fabrication process with final structures having flat surfaces. Epitaxially deposited films up to about 0.5–1.0 micrometers thick have been separated with conventional lateral isolation techniques, such as local oxidation (LOCOS) or sidewall masked isolation (SWAMI), but other techniques are needed for thicker films. Trench isolation is suitable for these thicker films, since a trench can be etched through several micrometers of silicon down to the underlying oxide layer.

DETAILED DESCRIPTION OF THE INVENTION

Figure 1A:
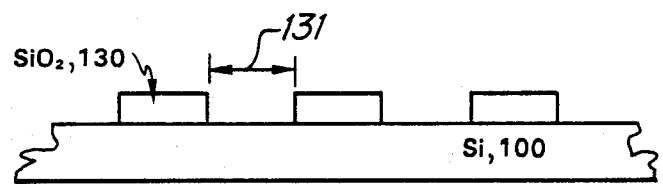
FIGS. 1A–1E illustrate a preferred embodiment of the disclosed method.

FIGS. 1A–1E illustrate a preferred embodiment of the present invention. Referring to FIG. 1A, on a silicon substrate 100 an insulating layer 130 is formed, typically consisting of silicon dioxide. A masking layer (not shown), typically consisting of photoresist, is placed over selected regions of the insulating layer 130. The insulating layer 130 is removed over region 131 of substrate 100 for example by an aqueous hydrofluoric acid solution. The photoresist mask (not shown) is removed in preparation for further processing.

Figure 1B:
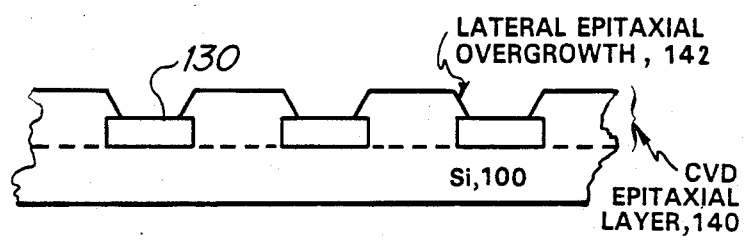

As illustrated in FIG. 1B, a first epitaxial layer 140 is formed over region 131 of substrate 100 and laterally over portions of insulating layer 130. Typically, epitaxial layer 140 is formed by chemical vapor deposition techniques with a slightly modified epitaxial procedure as described by D. R. Bradbury, Chi-Wing Tsao and Ted Kamins in a patent application Ser. No. 522,804 filed Aug. 12, 1983 entitled "CVD Lateral Epitaxial Growth of Silicon Over Insulators" using the pyrolysis of silane with the addition of HCl gas to suppress polysilicon nucleation on the silicon dioxide insulating layer 130.

Figure 1C:
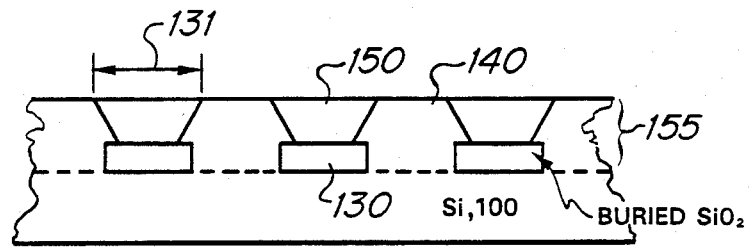

FIG. 1C shows a second epitaxial layer 150 formed over remaining exposed surface portions of insulating layer 130, to form a substantially flat surface with first epitaxial layer 140 and causing the portions of insulating layer 130 to be buried. Although shown as separate entities for clarity, second epitaxial layer 150 is an extension of first epitaxial layer 140 to form single layer 155.

Figure 1D:
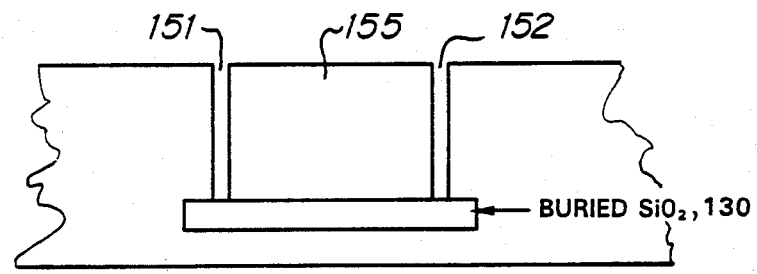

As illustrated in FIG. 1D, a masking layer (not shown), typically consisting of photoresist, is placed over selected regions of the epitaxial layer 155. Trenches 151 and 152 are then formed in portions of the epitaxial layer 155 for example by reactive ion etching. Trenches 151 and 152 are etched through the entire thickness of the epitaxial film 155 down to insulating layer 130. Photoresist masking layer (not shown) is then removed for further processing sequences.

Figure 1E:
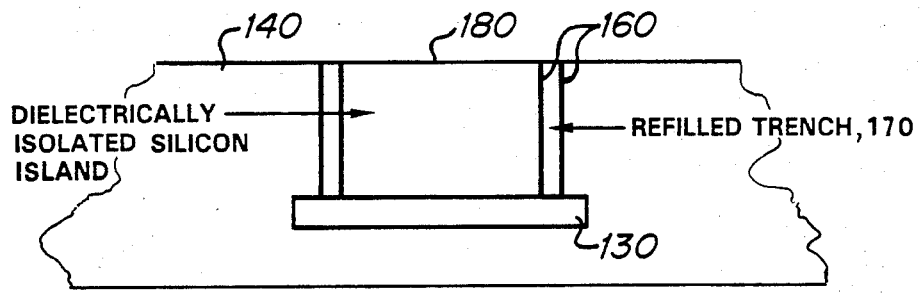

FIG. 1E shows the growth of an insulating oxide layer 160 on the sidewalls of trenches 151 and 152. The remaining portions of trenches 151 and 152 are then typically filled with CVD polycrystalline silicon 170. Insulating oxide layer 160 and CVD polycrystalline silicon 170 formed on exposed top surfaces 180 of the epitaxial layer 155 are removed by wet chemical and reactive ion etching techniques, respectively. Other materials suitable for filling trenches 151 and 152 after oxidation of the trench sidewalls are silicon dioxide, silicon nitride, and a combination of silicon dioxide and silicon nitride.

Figure 2:
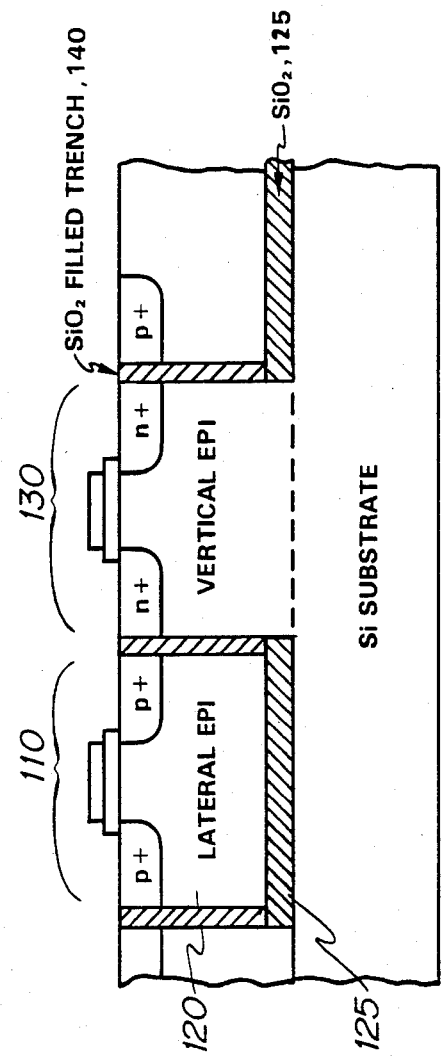
FIG. 2 illustrates a totally dielectrically isolated C-MOS structure according to the preferred embodiment.

FIG. 2 shows an application for single-crystal silicon film 120 grown over insulator 125 (SOI) in the fabrication of high-voltage switching devices or CMOS devices in which the p-channel transistor 110 would be placed in the silicon film 190 and completely isolated from the n-channel transistor 130 with oxides 140 and 125 to eliminate "latch-up" between devices.

What is claimed is:

1. A method for producing a semiconductor structure comprising the ordered steps of:
    forming a first insulating layer over a semiconductor substrate;
    removing a portion of said first insulating layer to form a first insulating region, said first insulating region being surrounded by an exposed region of said semiconductor substrate;
    forming a semiconductor layer over said first insulating region to form an essentially flat surface substantially parallel to the surface of said semiconductor substrate;
    removing a portion of said semiconductor layer over said first insulating region to form a trench region in said semiconductor layer, to expose a portion of the top surface of said first insulating layer, and to create an isolated island in said semiconductor layer;
    forming a second insulating layer over the walls of said trench region extending from the essentially flat surface to the first insulating region so that said isolated island is completely surrounded by said first and second insulating layers; and filling the remainder of said trench region with a solid material.

2. A method as in claim 1, wherein said semiconductor layer comprises silicon.

3. A method as in claim 2, wherein said second insulating layer comprises silicon dioxide.

4. A method as in claim 3, wherein said solid material comprises silicon dioxide.

5. A method as in claim 3, wherein said solid material further comprises silicon nitride.

6. A method as in claim 3, wherein said solid material further comprises a portion of silicon dioxide and silicon nitride.

7. A method as in claim 3, wherein said solid material further comprises silicon.

8. A method as in claim 1, wherein the step of removing a portion of said semiconductor layer comprises the step of plasma etching.

9. A method as in claim 1, wherein the step of removing a portion of said semiconductor layer further comprises the step of reactive ion etching.

10. A method as in claim 1, wherein said second insulating layer comprises silicon dioxide.

11. A method as in claim 10, wherein said solid material comprises silicon dioxide.

12. A method as in claim 10, wherein said solid material further comprises silicon nitride.

13. A method as in claim 10, wherein said solid material further comprises a portion of silicon dioxide and silicon nitride.

14. A method as in claim 10, wherein said solid material further comprises silicon.

15. A method as in claim 1, wherein said solid material comprises silicon dioxide.

16. A method as in claim 1, wherein said solid material further comprises silicon nitride.

17. A method as in claim 1, wherein said solid material further comprises a portion of silicon dioxide and silicon nitride.

18. A method as in claim 1, wherein said solid material further comprises silicon.

19. A method for producing a semiconductor structure comprising the ordered steps of:
   forming a first insulating layer over a semiconductor substrate;
   removing a portion of said first insulating layer to form a first insulating region, said first insulating region being surrounded by an exposed region of said semiconductor substrate;
   forming a semiconductor layer over said first insulating region to form an essentially flat surface substantially parallel to the surface of said semiconductor substrate;
   removing a portion of said semiconductor layer over said first insulating region to form a trench region in said semiconductor layer, to expose a portion of the surface of said first insulating layer, and to create an isolated island in said semiconductor layer; and
   filling said trench region with an insulating material extending from the essentially flat surface to the first insulating region so that said isolated island is completely surrounded by said first and second insulating layers.

20. A method as in claim 19, wherein said semiconductor layer is silicon.

21. A method as in claim 20, wherein said insulating material comprises silicon dioxide.

22. A method as in claim 20, wherein said insulating material further comprises silicon nitride.

23. A method as in claim 20, wherein said insulating material further comprises a portion of silicon dioxide, SiO2 and silicon nitride.

24. A method as in claim 19, wherein the step of removing a portion of said semiconductor layer comprises the step of plasma etching.

25. A method as in claim 19, wherein the step of removing a portion of said semiconductor layer further comprises the step of reactive ion etching.

26. A method as in claim 2 wherein said semiconductor layer is formed by epitaxial growth.

27. A method as in claim 20, wherein said semiconductor layer is formed by epitaxial growth.

* * * * *